United States Patent [19]
Peterson

[11] Patent Number: 6,055,815
[45] Date of Patent: May 2, 2000

[54] TEMPERATURE-CONTROLLED MICROCHIP LASER ASSEMBLY AND ASSOCIATED SUBMOUNT ASSEMBLY

[75] Inventor: Brian L. Peterson, Charlotte, N.C.

[73] Assignee: Litton Systems, Inc., Charlotte, N.C.

[21] Appl. No.: 09/183,227

[22] Filed: Oct. 30, 1998

[51] Int. Cl.$^7$ .................................................. F25B 21/02
[52] U.S. Cl. .............................. 62/3.7; 62/3.2; 62/259.2
[58] Field of Search .................... 62/259.2, 3.2, 62/3.7

[56] References Cited

U.S. PATENT DOCUMENTS

| | | | |
|---|---|---|---|
| 5,061,076 | 10/1991 | Hurley | 356/417 |
| 5,136,261 | 8/1992 | Lewis | 331/94.1 |
| 5,140,607 | 8/1992 | Paiva | 372/70 |
| 5,228,923 | 7/1993 | Hed | 136/208 |
| 5,329,539 | 7/1994 | Pearson et al. | 372/36 |
| 5,454,002 | 9/1995 | McCann | 372/36 |
| 5,515,682 | 5/1996 | Nagakubo et al. . | |
| 5,796,766 | 8/1998 | Hargis et al. | 372/36 |
| 5,918,469 | 7/1999 | Cardella | 62/3.7 |

*Primary Examiner*—Henry Bennett
*Assistant Examiner*—Mark Shulman
*Attorney, Agent, or Firm*—Alston & Bird LLP

[57] ABSTRACT

A microchip laser assembly provides a microchip laser along with an integral Peltier thermoelectric temperature controller and temperature sensor. The temperature sensor measures the temperature of the microchip laser during operation so that the polarity and magnitude of a direct current to Peltier thermoelectric elements may be controlled, thereby controlling the temperature of the microchip laser and stabilizing the optical output frequency or other microchip laser operating parameters. The microchip laser assembly can be mounted, along with a pump source, upon a submount such that the microchip laser can be optically pumped. As a result of the construction of the microchip laser assembly, the temperature of the microchip laser can be controlled independent of the temperature of the pump source.

22 Claims, 3 Drawing Sheets

TEMPERATURE-CONTROLLED MICROCHIP LASER ASSEMBLY AND ASSOCIATED SUBMOUNT ASSEMBLY

FIELD OF THE INVENTION

The present invention relates to microchip lasers and more particularly to a temperature controlled microchip laser assembly.

BACKGROUND OF THE INVENTION

In 1834 J. Peltier discovered that when an electric current passes through a junction formed by two different metals a temperature change across the junction results, and that one metal will be heated while the other is cooled. If the current is reversed, the first material will be cooled and the second material heated. Devices relying on the so-called Peltier effect are used in many applications for equipment temperature control, including refrigerators and cooling devices for microelectronic equipment.

Modern Peltier devices are typically composed of a plurality of alternate segments of heavily doped n-type and p-type semiconductors which are electrically connected in series and thermally connected in parallel. Peltier coolers are typically connected between the equipment to be cooled and a heat sink. Such devices are described, for example, in U.S. Pat. No. 4,929,282 to Brun et al. and in U.S. Pat. No. 5,448,109 to Cauchy, both of which are incorporated herein by reference.

Bismuth telluride (BiTe) is a popular choice of material for the construction of Peltier devices because the material is a semiconductor that is both a good conductor of electricity and a poor conductor of heat. In a typical application, alternate pairs of p-type and n-type regions of bismuth telluride are created by heavy doping.

A typical Peltier thermoelectric cooler consists of pairs of p-type and n-type material connected in series and sandwiched between two closely spaced ceramic plates. When connected to a DC power source, current flow through the series of p-n junctions causes heat to move from one side of the thermoelectric cooler to the other. In a typical application, the cold side of the thermoelectric cooler is connected to the equipment to be cooled while the hot side is connected to a heat sink for carrying the heat away. If the direction of current is reversed, however, the thermoelectric device can operate as a heater. The maximum power that a single practical thermoelectric cooler device can pump is about 125 Watts. However, multiple thermoelectric cooler devices can be used in a given cooler application if required.

As described above, both heating and cooling operations by a single Peltier device can be performed by controlling the magnitude and direction of a direct current flowing through the device. A Peltier device can thus be used to control the operating temperature of equipment by detecting the temperature of the equipment and controlling the current to the Peltier device mounted to the equipment accordingly. The overall performance of a Peltier device in controlling the temperature of the equipment is related to the efficiency of the thermal coupling between the Peltier device and the equipment to be controlled.

Peltier coolers are utilized in conjunction with a variety of electrical devices, including laser devices, to dispose of heat generated during the operation of the electrical device. For example, U.S. Pat. No. 5,515,682 to Nagakubo et al. ("Nagakubo") discloses a laser diode mounted on a Peltier device, with the Peltier device controlling the operating temperature of the laser diode through temperature feedback. According to Nagakubo, the small laser diode is mounted on the Peltier device, which is in turn mounted within a hybrid microelectronic package providing bias current for the diode laser and control circuitry for the Peltier temperature control device.

However, some electrical devices, including some laser devices, require even more precise temperature control than the temperature control required by a laser diode. For example, the temperature of a microchip laser must typically be maintained within a few degrees Fahrenheit in order to provide a laser output varying in frequency by less than two percent. The increased temperature control requirements of a microchip laser impose accordingly greater demands on the associated heat removal system.

A microchip laser is a single-crystal bulk laser device that emits coherent radiation upon stimulation by an external light source. For example, a neodymium yttrium aluminum garnet (Nd:YAG) crystal may be excited by an external pump laser source to deliver coherent radiation at fairly high power levels. Relative to other high power laser sources, such as gas lasers or semiconductor lasers, a microchip laser has the advantages of small size, simple construction, low cost and no need for electrical bias current.

High power microchip lasers, such as high power Nd:YAG microchip lasers, are designed to produce output pulses having a high peak output power, such as 10–30 kilowatts or more for a 1–100 kHz diode pumped Nd:YAG microchip laser. These high levels of output power are required in a number of applications, including laser radar, welding, materials processing, surface coating, isotope separation and x-ray lithography, among others. In order to obtain such high power levels, a primary laser, such as a microchip laser, can be pumped by a laser pump source.

In generating pulses having a relatively high average or high peak output power and a relatively high repetition rate, a microchip laser generates a significant amount of heat in a small space. The heat generated may be relatively large and may thereby elevate the temperature of the microchip laser, if not properly removed. The heat generated by a laser is inversely proportional to the optical pumping efficiency of the laser and may be calculated as $P_{OUT}/P_{ABS}$, where $P_{ABS} = P_{IN}(1-e-\alpha x)$ where $\alpha$ is the absorption coefficient of the microchip laser active region material and x is the length of the microchip laser active region material. Typically, the power generated as heat by a conventional microchip laser is approximately 85 percent of the optical power delivered to the microchip laser.

It is important that an effective means to remove heat from the microchip laser device be provided so as to avoid degrading the microchip laser by prolonged excessive temperature exposure. Moreover, temperature control of a high powered microchip laser is important for applications requiring precise laser output control. For example, the output frequency of a microchip laser can vary as a function of the temperature of the microchip laser. In applications where a nearly constant laser output pulse frequency is required, precise temperature control of the microchip laser is important.

A number of heat sinking approaches for the efficient removal of heat from microchip lasers have been deployed, such as by directly mounting or bonding a metallic or ceramic heat sink to the microchip laser and providing a thermal path for heat removal. Such cooling approaches can effectively remove heat, but are unable to provide the temperature control necessary for certain laser applications requiring precise control of output frequency or other laser operating parameters. Additionally, most conventional microchip laser assemblies utilize the same heat sink structure for both the microchip laser and the pump source (for example, the laser diode). Even though the microchip laser and the pump source may have significantly different thermal requirements and produce heat at different rates, conventional microchip laser assemblies typically do not provide for independent temperature control of the microchip laser and the pump source, thereby precluding individual optimization of the temperature of the microchip laser and the pump source.

SUMMARY OF THE INVENTION

It is an object of the present invention to provide a microchip laser assembly in which the temperature of the microchip laser is precisely controlled.

It is a further object of the present invention to provide a microchip laser assembly which provides temperature control of the microchip laser that is independent of the pump source temperature control.

These and other objects are provided, according to the present invention, by a microchip laser assembly comprising a housing having an interior cavity and a single crystal microchip laser disposed within the interior cavity of the housing, the microchip laser comprising an active gain medium and a saturable absorber for emitting pulses in response to optical pumping of the active gain medium. According to the invention, the microchip laser assembly further comprises a thermoelectric cooler and, more particularly, a Peltier cooler disposed in thermal communication with the microchip laser to remove heat from the microchip laser during its operation, along with a heat sink in thermal communication with the Peltier cooler to receive heat therefrom. In one embodiment, in which the housing is at least partially thermally conductive, the heat sink can be disposed in thermal communication with the housing such that heat generated during operation of the microchip laser is drawn from the microchip laser by the Peltier cooler and transferred via the housing to the heat sink.

According to one embodiment, the housing includes an outer body defining the interior cavity and an inner frame disposed within the interior cavity. The microchip laser is disposed within the inner frame of the housing and the thermoelectric cooler is disposed within the interior cavity of the housing between the outer body and the inner frame. Since the housing is at least partially thermally conductive, the thermoelectric cooler is disposed in thermal communication with the microchip laser to thereby remove heat from the microchip laser during its operation.

The microchip laser assembly can also include a temperature sensor for monitoring the temperature of the microchip laser and a controller for controlling the Peltier cooler in response to the temperature sensor. As such, the temperature of the microchip laser can be maintained within a predetermined range of temperatures. The microchip laser assembly of the present invention therefore permits the output of the microchip laser, including the output frequency, to be maintained more precisely by not only removing the larger amounts of heat generated by a microchip laser, but also precisely controlling the resulting temperature of the microchip laser.

The microchip laser assembly is preferably optically aligned with a pump source which pumps the active gain medium. In one advantageous embodiment, both the microchip laser and a pump source, such as a laser diode, are mounted upon a submount to form a microchip laser submount assembly. For example, the submount can define a groove having a sidewall upon which the pump source is mounted. By positioning the microchip laser assembly to bridge the groove and overlie the pump source, the pump signals emitted by the pump source will optically pump the active gain medium of the microchip laser. Once in operation, the heat drawn from the microchip laser by the Peltier cooler elements is then passed via the housing to the submount, which is also thermally conductive. Typically, the submount is mounted upon a heat sink, which disposes of the heat generated by the operation of the microchip laser. Accordingly, the microchip laser submount assembly provides temperature control of the microchip laser in a manner that is independent of the temperature of the pump source. Thus, the microchip laser submount assembly can more precisely control the temperature of the microchip laser.

DETAILED DESCRIPTION OF THE INVENTION

The present invention will now be described more fully with reference to the accompanying drawings, in which preferred embodiments of the invention are shown. This invention may, however, be embodied in many different forms and should not be construed as limited to the embodiments set forth here; rather, these embodiments are provided so that this disclosure will be thorough and complete and will fully convey the scope of the invention to those skilled in the art. Like numbers refer to like elements throughout.

Figure 1:
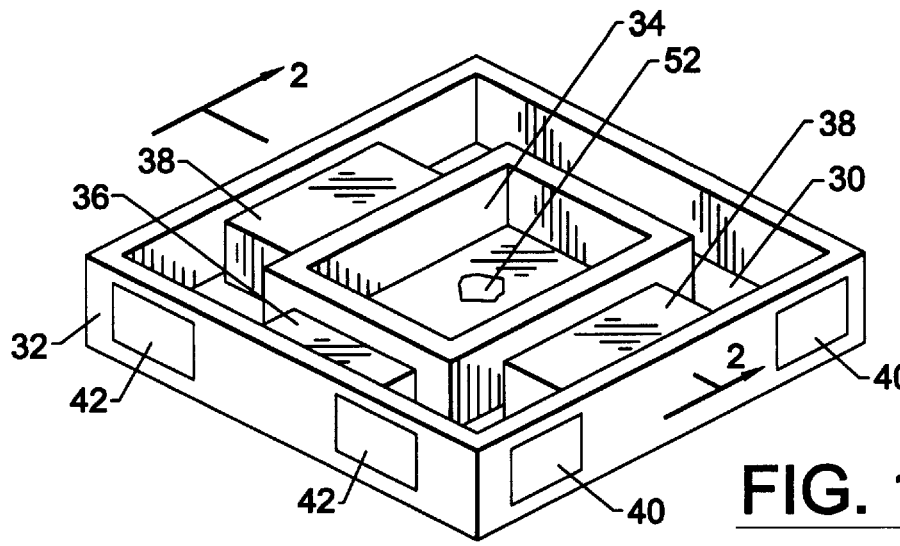
FIG. 1 is a perspective view of a portion of a microchip laser assembly, including a housing, a temperature sensor, and Peltier cooler elements, according to one embodiment of the present invention.

A microchip laser assembly according to one embodiment of the present invention is depicted in FIG. 1. The microchip laser assembly 20 includes a housing 30 defining an interior cavity and a microchip laser 50 (i.e., a microlaser) disposed within the interior cavity. As described in copending U.S. patent application Ser. No. 09/032,457, filed on Feb. 27, 1998 and assigned to Litton Systems, Inc., the contents of which are incorporated herein, a microchip laser preferably includes an active gain medium and a saturable absorber sandwiched between a pair of mirrors that define the resonant cavity. In this regard, one example of a suitable microresonator cavity is described by U.S. Pat. No. 5,394,413 to John J. Zayhowski which issued on Feb. 28, 1995, the contents of which are incorporated in their entirety herein. According to one advantageous embodiment, the microchip laser includes an active gain medium formed of neodymium-doped yttrium aluminum garnet (YAG) and the saturable absorber formed of tetravalent chrome-doped YAG. Although the active gain medium of one advantageous embodiment is doped with approximately 1.6 atomic percent of neodymium, the active gain medium and the saturable absorber can include different dopant percentages without departing from the spirit and scope of the present invention. The microresonator cavity of this embodiment will emit laser pulses having a wavelength of 1.06 microns. As will be apparent to those skilled in the art, however, the active gain medium and the saturable absorber can be constructed of different materials in order to provide laser outputs having different properties, such as different wavelengths.

The housing of one advantageous embodiment of the present invention includes an outer body 32 and an inner frame 34 connected to the outer body for receiving the microchip laser 50 and for removing the heat generated by a microchip laser 50 during its operation. In FIG. 1, the inner dimensions of the inner frame 34 of the housing 30 are chosen so that the microchip laser 50 will fit snugly within the inner frame 34 of the housing 30. In order to retain the microlaser chip within the inner frame 34, the side surfaces of the microchip laser (i.e., all surfaces of the microchip laser other than the opposed end surfaces defined by the mirrors) are plated with a solderable material, such as an alloy of gold and nickel, such that the microchip laser 50 can be soldered to the inner frame 34.

The housing 30 may be constructed of a material, such as aluminum oxide, which is thermally conductive but is electrically insulating. In addition, the inner surface of the inner frame 34 may be metallized so as to facilitate the soldering of the microchip laser to the inner frame.

Figure 2:
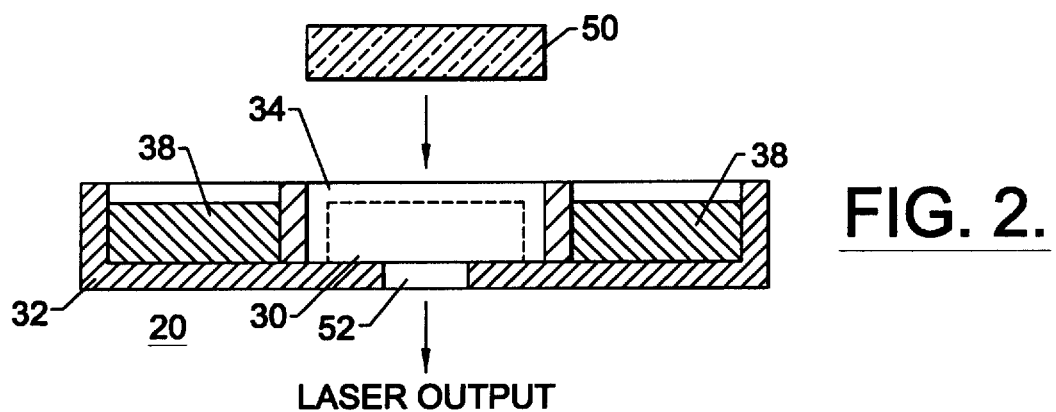
FIG. 2 is a side view of the microchip laser assembly of FIG. 1 indicating the insertion of the microchip laser in the housing according to one embodiment of the present invention.

As shown in FIG. 2 the inner frame 32 has an open first end through which the microchip laser 50 is inserted. The second end of the inner frame, opposite the first end, is at least partially closed by the outer body. The outer body does, however, define an aperture or window that is aligned with the inner frame. Typically, the aperture is a translucent material, such as sapphire. The microchip laser 50 is therefore inserted into the inner frame 34 such that the active gain medium faces the aperture defined by the outer body, while the saturable absorber faces the open first end of the inner frame. As described below, the microchip laser can thereby be pumped with pump signals that enter through the open first end of the inner frame and can emit laser pulses that are directed through the aperture defined by the active gain medium.

Figure 6:
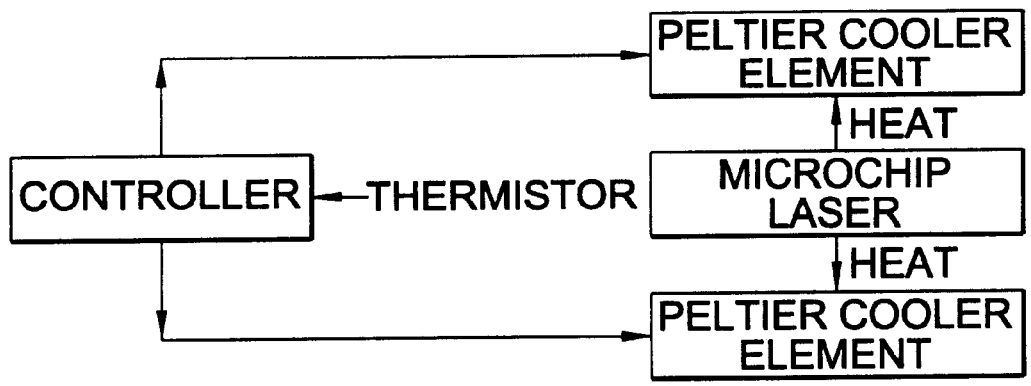
FIG. 6 is a block diagram of the microchip laser assembly according to one embodiment of the present invention that illustrates the interaction of the thermistor, the controller, and the Peltier cooler elements.

A temperature sensor, such as a thermistor 36, is preferably mounted within the housing 30 in close contact with the inner frame 34 of the housing so that the temperature of the microchip laser 50 may be indirectly measured. As shown in FIG. 1, for example, the temperature sensor can be mounted, such as by soldering, between the outer body 32 and the inner frame 34. Instead of a thermistor, other temperature sensing structures and approaches may be employed to detect changes in the temperature of the microchip laser without departing from the scope of the present invention. Thermistor contacts 42 are preferably provided in wells that extend through the outer body 32 so as to deliver signals from the thermistor 36 indicating the temperature of the microchip laser 50 to a controller. See FIG. 6.

In FIG. 1, Peltier cooler elements 38 are disposed between the outer body 32 and the inner frame 34 of the housing 30 and are in electrical communication with Peltier drive contacts 40 that extend through wells in the outer body 32 of the housing 30. The controller, in response to feedback from the thermistor 36 through the thermistor contacts 42, controls the polarity and level of direct current applied to each Peltier cooler element 38 so as to thereby control the temperature of a microchip laser 50 within a predetermined range of temperatures. For example, the temperature of a microchip laser is typically maintained within a range of 25 degrees Fahrenheit about room temperature such that the frequency of the laser pulses emitted by the microchip laser remains constant. For example, each of the Peltier cooler elements 38 may consist of an alternating assembly of p-type and n-type Peltier cooler material (such as doped bismuth telluride). Preferably, the Peltier cooler elements 38 are thermally connected in parallel between the inner frame 34 and the outer body 32 of the housing and are electrically connected in series between the Peltier drive contacts 40. As is known in the art, the flow of direct current through the Peltier cooler elements 38 results in the transfer of heat from the inner frame 34 of the housing 30 to the outer body 32 of the housing 30, or vice versa (depending on the polarity of the current). The Peltier cooler elements may be constructed of bismuth telluride, though other suitable thermoelectric materials may be utilized as is know in the art.

Figure 3:
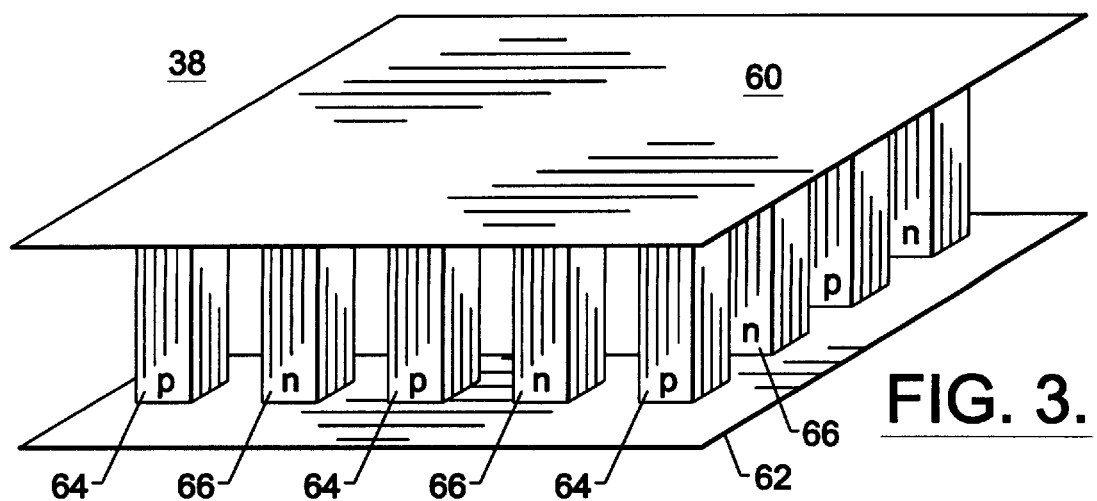
FIG. 3 is a perspective view of an individual Peltier cooler element according to one embodiment of the present invention.

FIG. 3 provides a perspective view of an individual Peltier cooler element 38 according to one embodiment of the present invention. Alternating p-type 64 and n-type 66 bismuth telluride elements are preferably disposed between a first substrate 60 and a second substrate 62 so that all of the elements 64 and 66 are thermally connected in parallel between the first substrate 60 and the second substrate 62. In one advantageous embodiment, the first substrate 60 and the second substrate 62 are each patterned with conductors so that a voltage applied across two contacts located at the first substrate 60 will cause a current to flow in opposite directions through each p-type 64 and n-type 66 element and thereby remove heat from the second substrate 62 to the first substrate 60. As is known in the art, materials other than bismuth telluride may be employed to construct the Peltier cooler elements 38. Moreover, other structures, element geometries, and substrate conductor patterns may be employed in the formation of Peltier cooler elements 38 to control the temperature of microchip laser 50 without departing from the scope of the present invention.

Figure 4:
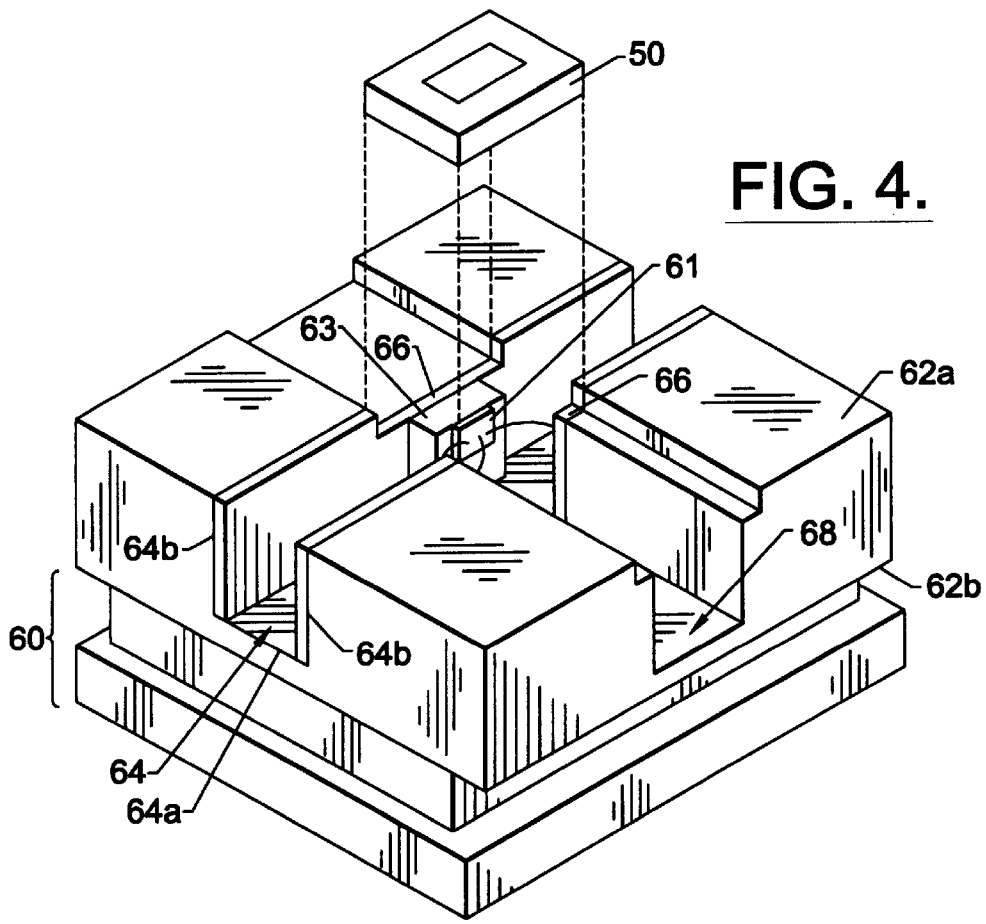
FIG. 4 is an exploded perspective view of a temperature controlled microchip laser submount assembly according to one embodiment of the present invention.
Figure 5:
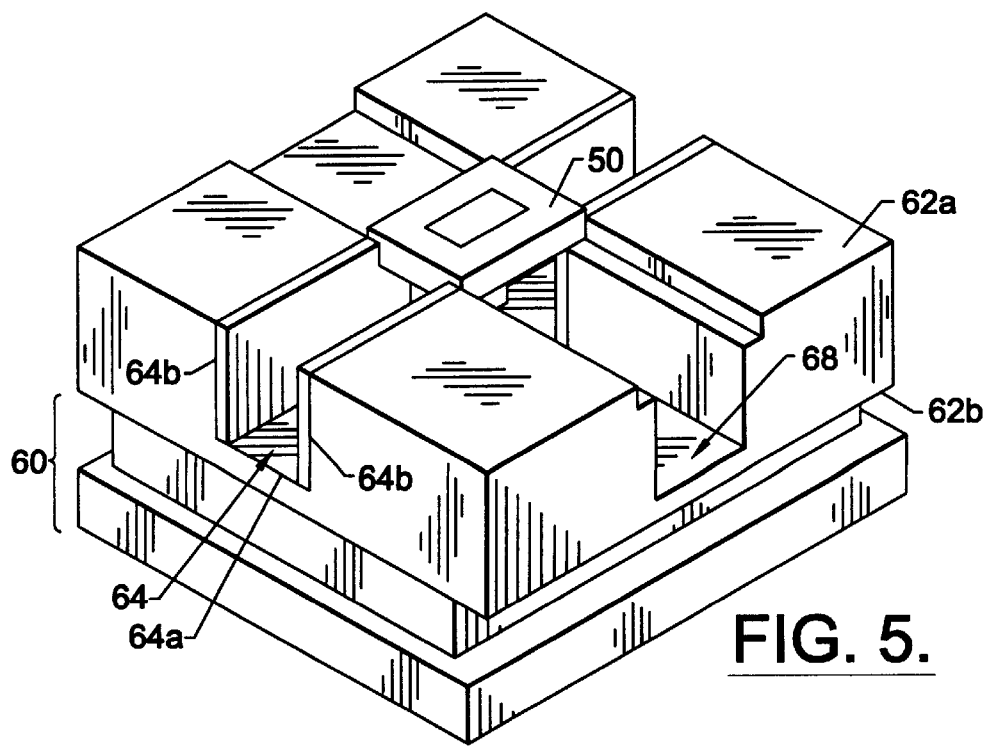
FIG. 5 is an assembled perspective view of the temperature controlled microchip laser submount assembly of FIG. 4.

Once the microchip laser 50 has been mounted within the housing 30, the microchip laser assembly is preferably positioned relative to a pump source, such as a laser diode, such that the active gain medium can be optically pumped. As shown in FIGS. 4 and 5, both the microchip laser assembly and the pump laser can be mounted upon a submount in an aligned relationship. In turn, the submount is mounted upon a heat sink 60. The submount 62 is formed of a thermally conductive material for providing a path of low thermal impedance to the heat sink 60. According to the present invention, the material, which forms the submount, is also preferably electrically insulating so as to electrically isolate the various electro-optic components mounted upon the submount. For example, the submount effectively electrically isolates the laser diode 61 and the microchip laser assembly as described below. Although the submount can be formed of a variety of thermally conductive, electrically insulating materials, the submount of one advantageous embodiment is formed of beryllium oxide, aluminum oxide or aluminum nitride which are both thermally conductive and electrically insulating.

Although the submount can be configured in a number of different manners, the submount of this advantageous embodiment has a first surface 62a which defines a first groove 64. The first groove opens through the first surface and has a bottom 64a and a pair of opposed sidewalls 64b. As shown in FIGS. 4 and 5, a laser diode 61 is mounted upon one sidewall of the first groove. In this regard, the laser diode is generally mounted upon a thermal spreader 63 which, in turn, is mounted to a sidewall of the first groove. The thermal spreader is formed of a thermally conductive material, such as gold metallized diamond. In this regard, the diamond is typically a synthetic diamond that has been grown by a chemical vapor deposition process. Once grown, the diamond is generally polished and a gold coating is evaporatively deposited upon the diamond. The thermal spreader also generally has a larger footprint than the laser diode so as to effectively spread the heat generated by the laser diode over a broader area of the submount. The laser diode is oriented such that the output of the laser diode is directed toward the opening of the first groove through the first surface of the submount. In the embodiment of the submount assembly illustrated in FIGS. 4 and 5, the output of the laser diode is directed in an upward direction.

The microchip laser assembly can then be mounted upon first surface 62a of the submount 62 so as to overlie at least that portion of the first groove 64 within which the laser diode 61 is disposed. As such, the output of the laser diode will pump the active gain medium so as to produce a series of laser output pulses. Although the microchip laser assembly can be supported by the first surface of the submount in a variety of fashions, the first surface of the submount of one advantageous embodiment defines a plurality of ledges 66 opening into the first groove. In this embodiment, edge portions of the housing can be supported by the plurality of ledges so as to bridge the first groove and overlie the laser diode. Preferably, the first surface of the submount defines ledges adjacent each of the opposed sidewalls 64b of the first groove for supporting the four corners of the housing as illustrated in FIGS. 4 and 5.

The submount 62 of this embodiment is preferably formed such that the laser diode 61 is appropriately spaced from the microchip laser. Although different spacings can be employed, the laser diode is generally spaced from the microchip laser by 20±5 microns. In order to provide the desired spacing, the laser diode is preferably mounted upon the thermal spreader 63 proximate one end thereof. By appropriately sizing the thermal spreader relative to the depth of the first groove, the laser diode can be appropriately spaced from the microchip laser by mounting the thermal spreader to the sidewall of the first groove such that the end of the thermal spreader opposite the laser diode contacts the bottom 64a of the first groove.

As shown in FIGS. 4 and 5, the first surface 62a of the submount 62 also preferably defines a second groove 68 extending between one edge of the submount and the first groove. The second groove preferably opens into the first groove at a position generally aligned with the laser diode 61 such that the laser diode is exposed via the second groove. As illustrated by FIGS. 4 and 5, the first and second grooves are preferably orthogonal. As such, the second groove facilitates the mounting of the laser diode upon the sidewall 64b of the first groove by permitting access to the sidewall of the first groove in a direction generally perpendicular to the sidewall. Although not necessary for the practice of the present invention, the cross-sectional shapes and dimensions of the first and second grooves are generally the same.

As further illustrated in FIGS. 4 and 5, first and second metallization layers are also generally disposed upon different portions of the submount 62. Although the metallization layers can be formed from a variety of electrically conductive materials, the first and second metallization layers of one advantageous embodiment are formed of diffusion bonded copper. Although the first and second metallization layers can be disposed within recesses defined by the first surface 62a of the submount, the first and second metallization layers of the illustrated embodiment are disposed upon opposite sidewalls 64b of the first groove. By metallizing the thermal spreader 63 upon which the laser diode 61 is mounted, electrical contact is established between the laser diode and the metallization layer coating the sidewall upon which the laser diode is mounted. As shown, wire bonds or ball bonds can be established between the laser diode and the metallization layers coating the other sidewall of the first groove. By applying appropriate voltage and current to the metallization layers, the laser diode can be driven so as to produce an output which pumps the microchip laser overlying the laser diode.

The submount is preferably mounted upon a heat sink, such as with a thermally matched epoxy, such as aluminum filled epoxy, silver filled epoxy or indium solder. It will be understood by those having skill in the art that an element or component that is described as being "on" or "mounted upon" another element may be either mounted directly on the underlying element or may merely overlie the other element with one or more intervening layers or elements being disposed between the elements. Although the heat sink can be a passive heat sink formed of thermally conductive material, such as a silver base plated with an alloy of gold and nickel, the heat sink can also be an active heat sink or heat pump such as a Peltier cooler or other thermoelectric cooler. As used herein, the term "heat sink" therefore includes not only heat sinks which cool a component by accepting waste heat, but also heat pumps which generate additional heat in order to warm a component. The submount assembly, consisting of the microchip laser assembly, the submount, the laser diode and the heat sink, can also be mounted within an appropriate electro-optic package, such as a TO-3 or TO-8 package, as described by copending U.S. application Ser. No. 09/032,457.

In operation, when laser energy from the pump laser is supplied to the microchip laser assembly 20, stimulated emission of optical energy is induced in the microchip laser 50 and a series of high power coherent optical pulses is emitted by the microchip laser assembly 20 and is directed through the aperture defined by the outer body 32. Significant heat may be generated within the microchip laser 50 during the aforedescribed emission, and such heat may induce a temperature change of the active gain medium. Such temperature change, without correction, may be disadvantageous; for example, the temperature change may result in a change in the output frequency of the microchip laser emission, and such output frequency change may not be acceptable in certain applications requiring a stable output. Moreover, stability in other important laser parameters may be disadvantageously degraded by an uncorrected temperature change in microchip laser 50.

The microchip laser assembly 20 of the present invention can control the temperature of the microchip laser 50 during operation, independent of the temperature of the laser diode or other components mounted upon the submount, and may hence control (i.e., stabilize) the optical output frequency and other operating characteristics of the microchip laser 50. For example, as the temperature of the microchip laser 50 tends to rise during operation, the thermistor 36 detects that temperature change and provides an electrical signal responsive to that temperature change through the thermistor contacts 42 to the controller, according to one advantageous embodiment of the present invention. Once the temperature of the microchip laser 50 reaches a predetermined desired operating temperature, the controller responds to additional microchip laser temperature increases by providing a direct current through the Peltier drive contacts 40 to the Peltier cooler elements 38 with a polarity that results in heat flow from the microchip laser to the inner frame 34 of the housing 30 and then to the outer body 32 of the housing 30 through the Peltier cooler elements 38, thus tending to reduce the temperature of the microchip laser 50. Since the housing is preferably mounted, either directly or indirectly via a submount, upon a heat sink, the outer body of the housing generally passes the waste heat along to the heat sink. In the embodiment illustrated in FIGS. 4 and 5, for example, the outer body 32 is mounted to the submount such that heat flows through the outer body to the submount and, in turn, to the underlying heat sink for disposal. By controlling the amount of heat extracted from the microchip laser by the Peltier cooler elements, the control feedback loop thus established may be employed to control the temperature of the microchip laser 50 within a predetermined temperature range. The extent to which the temperature of the microchip laser 50 can be precisely controlled within a narrow temperature range will be a function of, among other factors, the thermistor response time and the thermal resistance between the microchip laser 50, the inner frame 34, the thermistor 36, the Peltier cooler elements 38 and the outer body 32.

If the temperature of the microchip laser 50 during operation falls below the predetermined temperature range, such as may occur during intermittent operation or during reduced power operation, the microchip laser assembly 20 of the present invention can maintain the temperature of the microchip laser 50 within the predetermined temperature range by reversing the current flow through the Peltier cooler elements 38 from the controller in response to reduced temperature indications from the thermistor 36. In the heating mode just described, the Peltier cooler will serve as a heat pump to warm the microchip laser 50. The aforementioned feedback control loop may be employed to maintain the temperature of the microchip laser 50 both when the microchip laser is generating excess heat and when the microchip laser is generating very little heat, thereby stabilizing the temperature of the microchip laser and the output frequency or other operating parameters of the microchip laser 50 over a broad range of operating conditions.

By incorporating Peltier cooler elements into the microchip laser assembly, the temperature of the microchip laser can be controlled independent of the temperature of the laser diode and other components mounted upon the submount. In this regard, the heat generated by the laser diode flows through the thermal spreader and the submount and is collected by the heat sink without ever affecting the temperature of the microchip laser. Thus, the microchip laser and the laser diode can be operated at different temperatures, if so desired.

A calibration sequence is preferably employed to characterize the microchip laser 50 and to program the controller with the set of Peltier element drive currents necessary to stabilize the microchip laser 50 over a range of predetermined operating conditions. The calibration procedure will preferably determine the amount of drive current and the polarity necessary to maintain the microchip laser 50 at various temperatures during a number of operating conditions. Such operating conditions may include high and low power modes, intermittent operating modes, pulsed output modes, differing ambient temperature environments, and other operating variations. For example, the controller may store a range of drive current levels and polarities required to maintain the microchip laser 50 at a range of temperatures under a range of operating conditions, so that the temperature of the microchip laser 50, and hence the operating characteristics of the microchip laser 50, may be maintained as desired in a number of operating modes.

The microchip laser assembly 20 of the present invention therefore overcomes limitations imposed by conventional microchip laser assemblies. In particular, a microchip laser assembly 20 is provided with the temperature control needed in certain laser applications requiring precise control of optical output frequency or other laser parameters.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A temperature-controlled microchip laser assembly comprising:

a housing comprising an outer body defining an interior cavity and an inner frame disposed within the interior cavity, wherein the housing is at least partially thermally conductive;

a single crystal microlaser disposed within the inner frame of said housing, said microlaser comprising an active gain medium and a saturable absorber for emitting pulses in response to optical pumping of the active gain medium;

a Peltier cooler disposed within the interior cavity of said housing, wherein said Peltier cooler is in thermal communication with both said microlaser and said housing; and a heat sink disposed in thermal communication with said housing such that heat generated during operation of said microlaser is drawn from said microlaser by said Peltier cooler and transferred via said housing to said heat sink.

2. A temperature-controlled microchip laser assembly according to claim 1 further comprising:

a temperature sensor for monitoring the temperature of said microlaser; and a controller, responsive to said temperature sensor, for controlling said Peltier cooler such that the temperature of said microlaser is maintained within a predetermined range of temperatures.

3. A temperature-controlled microchip laser assembly according to claim 2 wherein said controller includes a predetermined schedule of drive currents for each of a plurality of operating conditions.

4. A temperature-controlled microchip laser assembly according to claim 1 wherein said Peltier cooler is formed of bismuth telluride.

5. A temperature-controlled microchip laser assembly according to claim 1 wherein the outer body of said frame is mounted to said heat sink, and wherein said Peltier cooler is disposed between the inner frame and the outer body such that heat generated during operation of said microlaser is directed by said Peltier cooler to said heat sink.

6. A temperature-controlled microchip laser assembly according to claim 1 wherein said heat sink is integrally formed with said housing.

7. A temperature-controlled microchip laser assembly comprising:
   a housing comprising:
      an outer body defining an interior cavity; and
      an inner frame disposed within the interior cavity such that the outer body circumferentially surrounds the inner frame;
   a microlaser disposed within the inner frame of said housing for emitting coherent radiation in response to optical pumping thereof; and
   a thermoelectric cooler disposed within the interior cavity of said housing between said outer body and said inner frame, said thermoelectric cooler disposed in thermal communication with said microlaser to remove heat from said microlaser during operation thereof.

8. A temperature-controlled microchip laser assembly according to claim 7 wherein the outer body of said housing defines an aperture through which coherent radiation emitted by said microlaser is directed.

9. A temperature-controlled microchip laser assembly according to claim 7 further comprising:
   a temperature sensor for monitoring the temperature of said microlaser; and
   a controller, responsive to said temperature sensor for controlling said thermoelectric cooler such that the temperature of said microlaser is maintained within a predetermined range of temperatures.

10. A temperature-controlled microchip laser assembly according to claim 9 wherein said controller includes a predetermined schedule of drive currents for each of a plurality of operating conditions.

11. A temperature-controlled microchip laser assembly according to claim 7 wherein said thermoelectric cooler comprises a Peltier cooler formed of bismuth telluride.

12. A temperature-controlled microchip laser assembly according to claim 7 wherein the outer body and the inner frame of said housing are formed of a thermally conductive material.

13. A temperature-controlled microchip laser assembly according to claim 7 further comprising a heat sink disposed in thermal communication with the outer body of said housing, and wherein the outer body and the inner frame of said housing are at least partially thermally conductive such that heat generated during operation of said microlaser is drawn from said microlaser by said thermoelectric cooler and transferred via said housing to said heat sink.

14. A temperature-controlled microchip laser submount assembly comprising:
   a submount comprised of a thermally conductive material;
   a pump source for emitting pump signals, said pump source mounted upon said submount in thermal communication therewith such that heat generated during operation of said pump source is transferred to said submount; and
   a microchip laser assembly mounted upon said submount in optical alignment with said pump source, said microchip laser assembly comprising:
      a housing mounted upon said submount, said housing being at least partially thermally conductive;
      a microlaser, disposed within said housing, for emitting pulses in response to optical pumping by the pump signals; and
      a Peltier cooler disposed within said housing, wherein said Peltier cooler is in thermal communication with both said microlaser and said housing such that heat generated during operation of said microlaser is drawn from said microlaser by said Peltier cooler and transferred via said housing to said submount, thereby permitting the temperature of said microlaser to be controlled independent of the temperature of said pump source.

15. A temperature-controlled microchip laser submount assembly according to claim 14 wherein said submount defines a groove having a pair of opposed sidewalls, and wherein said pump source comprises a laser diode mounted to one of the sidewalls of the groove defined by said submount.

16. A temperature-controlled microchip laser submount assembly according to claim 15 wherein said microchip laser assembly is mounted upon said submount so as to overlie the laser diode mounted within the groove defined by said submount.

17. A temperature-controlled microchip laser submount assembly according to claim 14 further comprising a heat sink upon which said submount is mounted.

18. A temperature-controlled microchip laser submount assembly according to claim 14 further comprising:
   a temperature sensor for monitoring the temperature of said microlaser; and
   a controller, responsive to said temperature sensor, for controlling said Peltier cooler such that the temperature of said microlaser is maintained within a predetermined range of temperatures.

19. A temperature-controlled microchip laser submount assembly according to claim 18 wherein said controller includes a predetermined schedule of drive currents for each of a plurality of operating conditions.

20. A temperature-controlled microchip laser submount assembly according to claim 14 wherein said housing comprises an outer body defining an interior cavity and an inner frame disposed within the interior cavity, and wherein said microlaser is disposed within the inner frame.

21. A temperature-controlled microchip laser submount assembly according to claim 20 wherein the outer body of said frame is mounted to said submount, and wherein said Peltier cooler is disposed between the inner frame and the outer body such that heat generated during operation of said microlaser is directed by said Peltier cooler to said submount.

22. A temperature-controlled microchip laser submount assembly according to claim 21 wherein said outer body includes contacts for feedback control of the Peltier cooler.

* * * * *